(12) United States Patent
Ahn et al.

(10) Patent No.: US 7,528,022 B2
(45) Date of Patent: May 5, 2009

(54) METHOD OF FORMING FIN FIELD EFFECT TRANSISTOR USING DAMASCENE PROCESS

(75) Inventors: Young-Joon Ahn, Daejeon (KR); Dong-Gun Park, Gyeonggi-do (KR); Choong-Ho Lee, Gyeonggi-do (KR); Hee-Soo Kang, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 379 days.

(21) Appl. No.: 11/112,818

(22) Filed: Apr. 21, 2005

(65) Prior Publication Data

US 2005/0255643 A1 Nov. 17, 2005

(30) Foreign Application Priority Data

May 14, 2004 (KR) .................... 10-2004-0034352

(51) Int. Cl.
H01L 21/8234 (2006.01)
(52) U.S. Cl. .................... 438/156; 438/212; 257/329; 257/E21.41
(58) Field of Classification Search ............... 438/141, 438/142, 149, 197, 923, 156, 157, 212; 257/329, 257/E21.41
See application file for complete search history.

(56) References Cited

U.S. PATENT DOCUMENTS

| | | | |
|---|---|---|---|
| 5,844,278 A * | 12/1998 | Mizuno et al. ............... 257/345 |
| 6,525,403 B2 * | 2/2003 | Inaba et al. .................. 257/618 |
| 6,642,090 B1 | 11/2003 | Fried et al. |
| 6,645,797 B1 | 11/2003 | Buynoski et al. |
| 6,657,252 B2 * | 12/2003 | Fried et al. ................... 257/316 |
| 6,787,404 B1 * | 9/2004 | Lee et al. ..................... 438/151 |
| 2004/0007738 A1 * | 1/2004 | Fried et al. .................. 257/329 |
| 2004/0150029 A1 * | 8/2004 | Lee ............................. 257/308 |
| 2005/0051825 A1 * | 3/2005 | Fujiwara et al. ............. 257/308 |
| 2005/0202608 A1 * | 9/2005 | Beintner ...................... 438/164 |

FOREIGN PATENT DOCUMENTS

KR 2003-0020644 3/2003

OTHER PUBLICATIONS

English language abstract of Korean Publication No. 2003-0020644.

* cited by examiner

Primary Examiner—Douglas M Menz
Assistant Examiner—Steven J. Fulk
(74) Attorney, Agent, or Firm—Marger Johnson & McCollom, P.C.

(57) ABSTRACT

A method of forming a fin transistor using a damascene process is provided. A filling mold insulation pattern is recessed to expose an upper portion of a fin, and a mold layer is formed. The mold layer is patterned to form a groove crossing the fin and exposing a part of the upper portion of the fin. A gate electrode is formed to fill the groove with a gate insulation layer interposed between the fin and the gate electrode, and the mold layer is removed. Impurities are implanted through both sidewalls and a top surface of the upper portion of the fin disposed at opposite sides of a gate electrode to form a source/drain region.

11 Claims, 9 Drawing Sheets

METHOD OF FORMING FIN FIELD EFFECT TRANSISTOR USING DAMASCENE PROCESS

CROSS-REFERENCE TO RELATED APPLICATIONS

This application claims priority from Korean Patent Application No. 2004-34352, filed on May 14, 2004 in the Korean Intellectual Property Office, the disclosure of which is incorporated herein by reference in its entirety.

BACKGROUND OF THE INVENTION

1. Field of the Invention

The invention relates to a method of forming a semiconductor device and, more particularly, to a method of forming a fin field effect transistor using a damascene process.

2. Description of Related Art

With the recent trend toward smaller semiconductor devices, field effect transistors of semiconductor devices (hereinafter referred to as "transistors") have been scaled down. However, the short channel effect or drain induced barrier lower (DIBL) phenomenon makes it difficult to scale down transistors further. In view of the foregoing, fin transistors have been proposed. A typical fin transistor includes a fin vertically protruding from a substrate and a gate electrode crossing the fin. The gate electrode of the fin transistor is disposed on both sidewalls of a thin fin, thereby enhancing the controllability of a channel of the gate electrode and also suppressing the short channel effect or DIBL phenomenon.

A conventional method of forming a fin field effect transistor is described with reference to FIG. 1 through FIG. 3.

Referring to FIG. 1, a substrate 1 is selectively etched to form a vertically extending fin 2. A silicon oxide layer is formed on the entire surface of the substrate 1 to fill the etched region of the substrate 1. The silicon oxide layer is planarized to form a filling oxide pattern 3 along the sidewalls of the fin 2, until the fin 2 is exposed.

A nitride layer 4 is formed on the entire surface of the substrate 1. The nitride layer 4 is patterned to form a preliminary groove 5 crossing the fin 2. The preliminary groove 5 partially exposes the top surface of the fin 2 and the filling oxide pattern 3 disposed on opposite sides adjacent to the top surface of the exposed fin 2.

Referring to FIG. 2 and FIG. 3, the filling oxide pattern 3 exposed by the preliminary groove 5 is anisotropically etched to expose both sidewalls of the fin 2, using the nitride layer 4 as a mask. The etched region 6 of the filling oxide pattern 3 and the preliminary groove 5 constitute a groove 7.

A gate oxide layer 8 is formed on the substrate 1 having the groove 7. A gate electrode 9 is formed on the gate oxide layer 8 to fill the groove 7. The nitride layer 4 is removed to expose the top surface of the fin 2 disposed at both sides of the gate electrode 9.

Using the gate electrode 9 as a mask, impurities are implanted to form a source/drain region 10 at opposite sides adjacent to the gate electrode 9.

In the above-described conventional method, following formation of the fin 2, a trimming process may be performed to minutely control the width of the fin 2. According to the trimming process, a thermal oxide layer is formed on the surface, including the sidewalls, of the fin 2. The thermal oxide layer is removed using a wet etch, thereby smoothening the sidewalls of the fin 2 and also controlling the width of the fin 2. Preferably, only the width of a channel area disposed below the gate electrode 9 is controlled. If the width of the source/drain region 10 is also reduced, a contact area between a later-formed interconnection (not shown) and the source/drain region 10 is reduced and the contact resistance is increased. Therefore, the trimming process may be performed following formation of the groove 7 and prior to formation of the gate oxide layer 8. Even in this case, various problems may occur.

Specifically, a thermal oxide layer formed in the trimming process and the filling oxide pattern 3 are made of silicon oxide, and the wet etch of the trimming process is an isotropic etch. The thermal oxide layer of the fin 2, as well as the lower inner sidewalls of the groove 7, is etched in the wet etch of the trimming process. Since this leads to an increase in the width of the lower portion of groove 7, the line width of the gate electrode 9 formed on both sidewalls of the fin 2 may increase. As a result, the gate electrode 9 and the source/drain region 10 formed on the both sidewalls of the fin 2 may be shorted by an interconnection (not shown) connected to the source/drain region 10. Further, an overlap area of the gate electrode 9 and the source/drain region 10 is widened to increase a parasitic capacitance created by the gate electrode 9 and the source/drain region 10. Thus, the operating speed of the fin transistor may be lowered (i.e., the fin transistor may be degraded).

Moreover, the conventional method may cause other problems. Because impurities for forming the source/drain region 10 are implanted through the top surface of the fin 2 disposed on opposite sides adjacent to the gate electrode 9, the impurity concentration of the source/drain region may vary with portions of the source/drain region 10. Particularly, the impurity concentration in portions of the source/drain region 10 formed on both sidewalls of the fin 2 may be lower than that in portions of the source/drain regions 10 formed on the top surface of the fin 2. Thus, turn-on current flowing through a channel region formed on both sidewalls of the fin 2 may be decreased, thereby degrading electrical characteristics of the fin transistor.

SUMMARY OF THE INVENTION

Exemplary embodiments of the invention are directed to a method of forming a fin transistor using a damascene process. In an exemplary embodiment, the method comprises forming a vertically protruding fin on a substrate. A filling insulation pattern is formed along the sidewalls of the fin. The filling insulation pattern is recessed to expose an upper portion of the fin. A mold layer is formed to cover the filling insulating pattern and the fin formed on the substrate. The mold layer is patterned to form a groove crossing the fin. The groove partially exposes the upper portion of the fin, creating a channel portion. A gate electrode is formed to fill the groove with a gate insulation layer interposed the fin and the gate electrode. The mold layer is removed to expose the upper portion of the fin, the exposed portions disposed at opposite sides adjacent to the gate electrode. Using the gate electrode as a mask, impurities are implanted through both sidewalls and the top surface of the exposed portions of the fin to form a source/drain region.

In some embodiments, the filling insulation pattern is recessed using a wet etch. Prior to formation of the gate insulation layer, the method may further comprise trimming, at least once, the channel portion of the fin to control the width of the channel portion of the fin. The trimming process includes a thermal oxidation process and a wet etch process.

The mold layer is made of a material having an etch selectivity with respect to a thermal oxide layer.

BRIEF DESCRIPTION OF THE DRAWINGS

FIG. 4A through FIG. 10A are perspective views illustrating a method of forming a fin field effect transistor according to the invention.

FIG. 4B through FIG. 9B are cross-sectional views taken along lines I-I' of FIG. 4A through FIG. 9A, respectively.

DETAILED DESCRIPTION OF THE PREFERRED EMBODIMENTS

Figure 1:
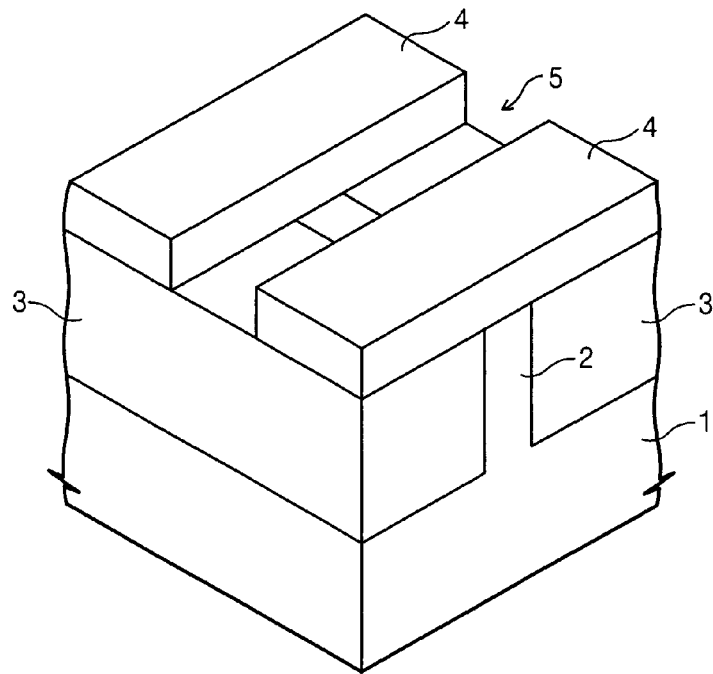
FIG. 1 through FIG. 3 are perspective views illustrating a conventional method of forming a fin field effect transistor.
Figure 2:
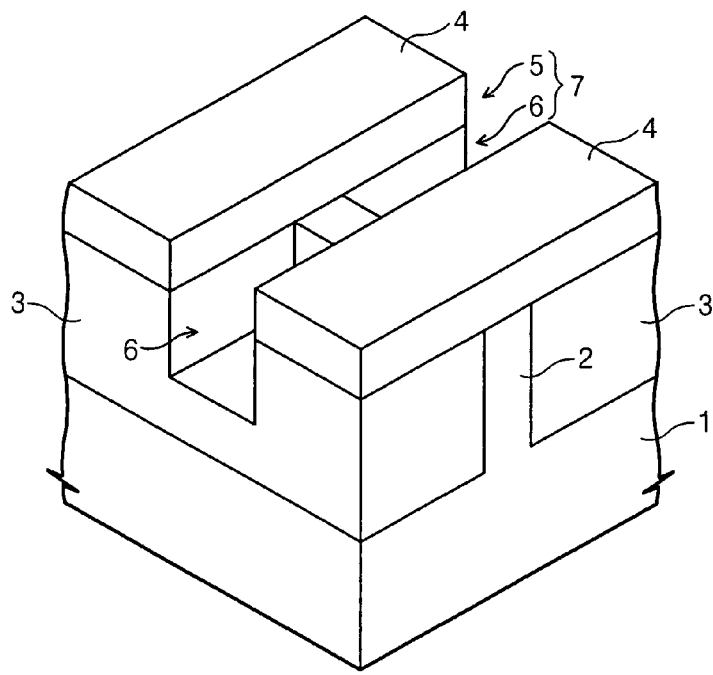
Figure 3:
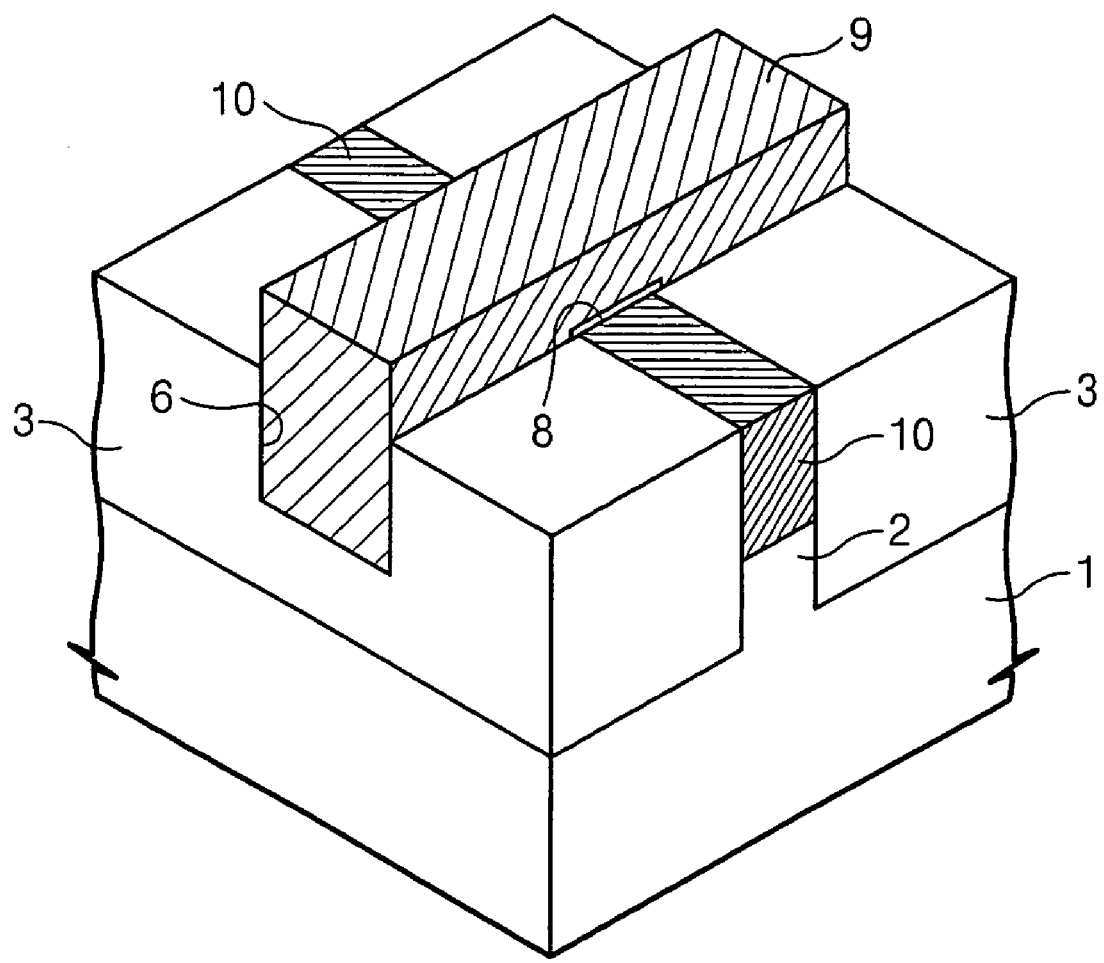

The invention will be described below with reference to the accompanying drawings, in which embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will be understood that when a layer is referred to as being "on" another element, it can be directly on the element or intervening elements may also be present. Like reference numerals refer to similar or identical elements throughout.

Figure 4A:
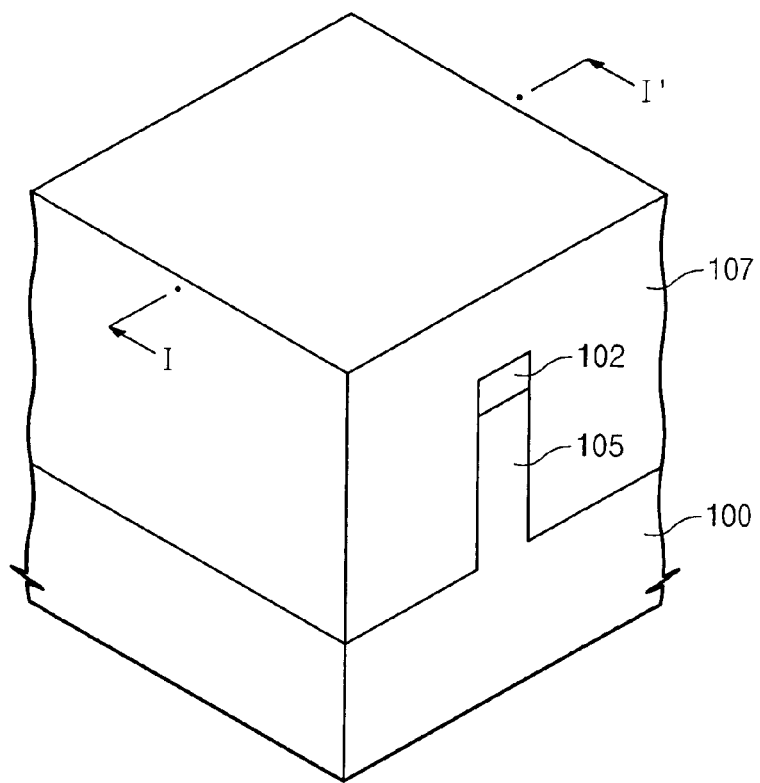
Figure 4B:
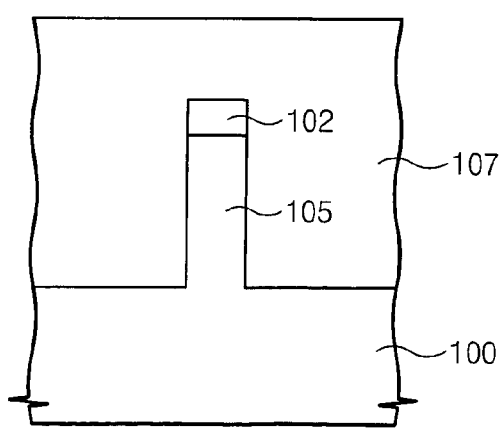

As illustrated in FIG. 4A and FIG. 4B, a hard mask pattern 102 is formed on a predetermined region of a substrate 100. The substrate 100 is etched to form a vertically protruding fin 105, using the hard mask pattern 102 as a mask. The hard mask pattern 102 may be made of a material such as silicon nitride.

A filling insulation layer 107 is formed on the substrate 100 to fill the etched area of the substrate 100. The filling insulation layer 107 may be made of an insulator having an excellent gap-fill capability, e.g., high-density-plasma (HDP) silicon oxide or silicon-on-glass (SOG).

Figure 5A:
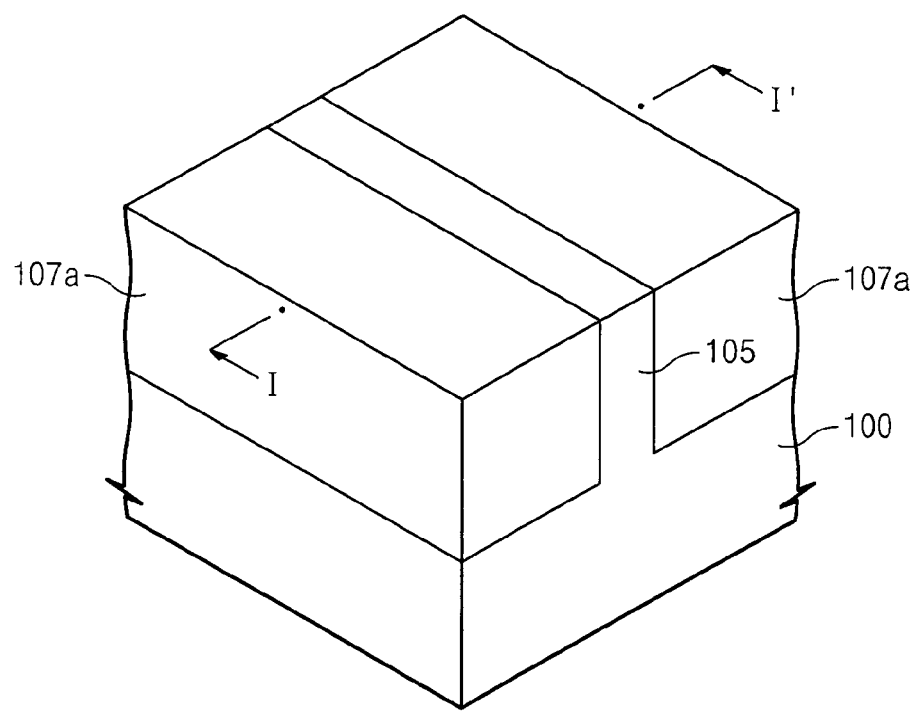
Figure 5B:
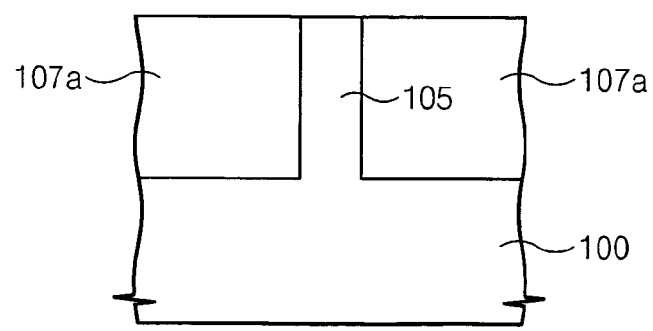

As illustrated in FIG. 5A and FIG. 5B, the filling insulation layer 107 and the hard mask pattern 102 are planarized down to a top surface of the fin 105 to form a filling insulation pattern 107a disposed along the sidewalls of the fin 105. The planarization of the filling insulation layer 107 and the hard mask pattern 102 may be performed using an etch-back or chemical mechanical polishing (CMP).

In detail, the filling insulation layer 107 is planarized, until the hard mask pattern 102 is exposed, using an etch-back or CMP. The planarized filling insulation layer 107 is recessed to about the top surface of the fin 105. Then, the hard mask pattern 102 may be removed using an etch-back to expose the top surface of the fin 105. In the alternative, the hard mask pattern 102 can be removed before recessing the planarized filling insulation layer 107. The filling insulation layer 107 and the hard mask pattern 102 may be planarized using other methods.

Figure 6A:
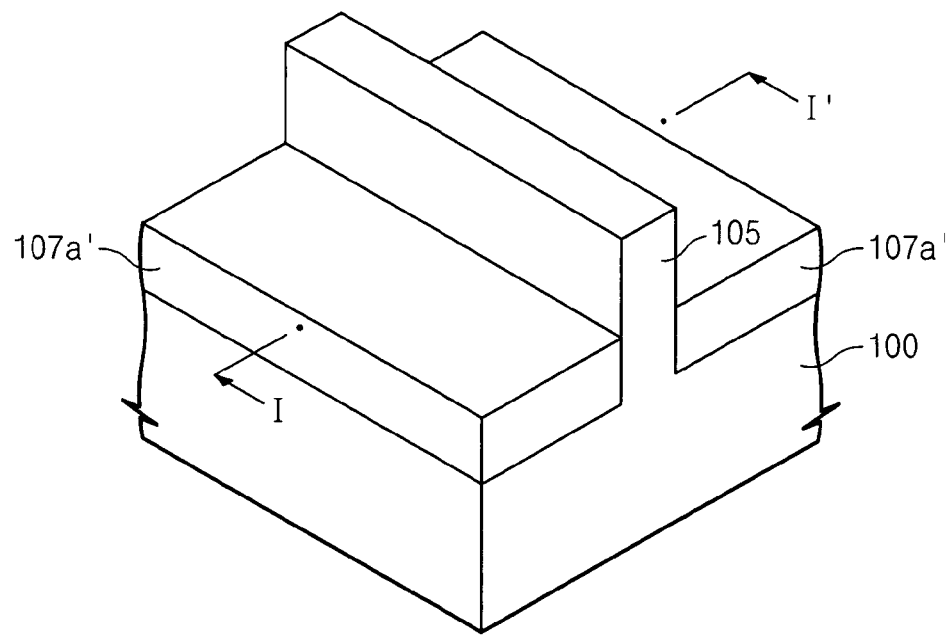
Figure 6B:
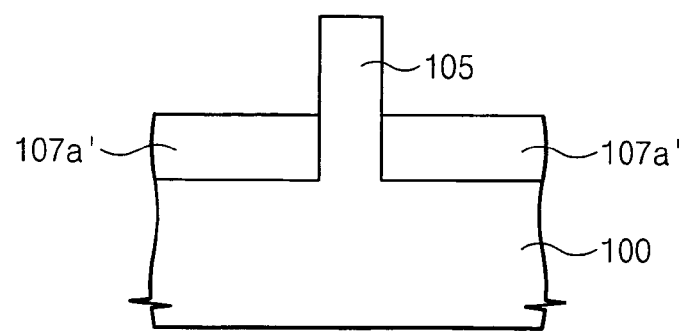
Figure 7A:
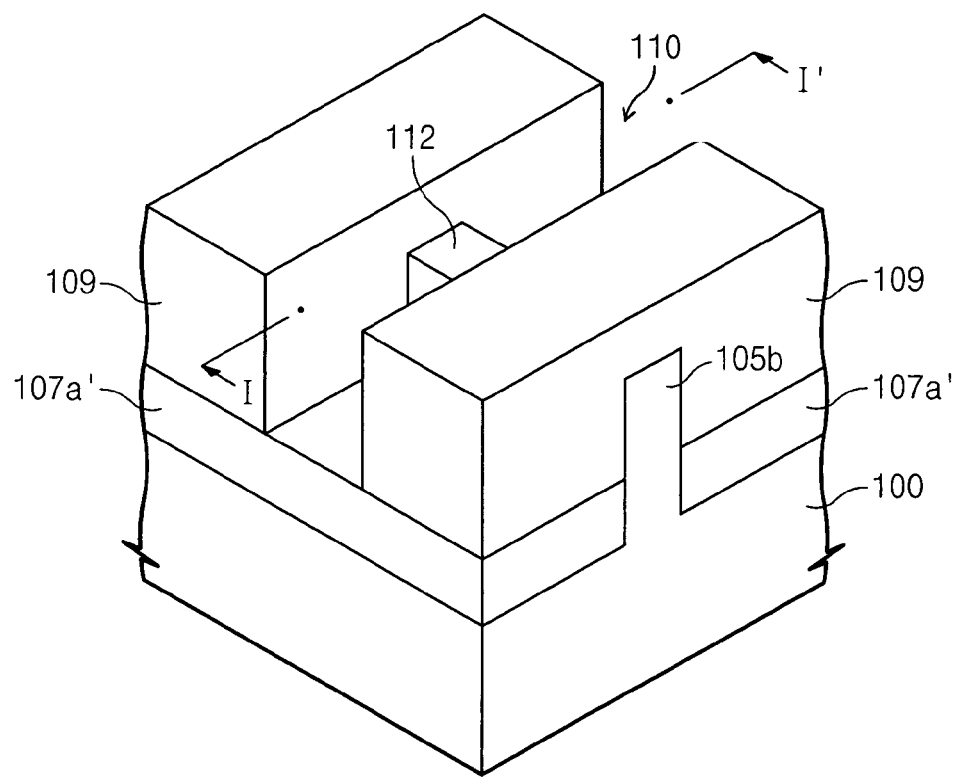
Figure 7B:
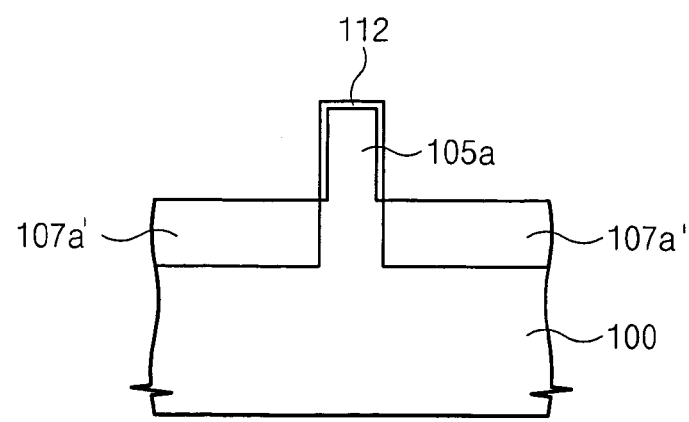
Figure 8A:
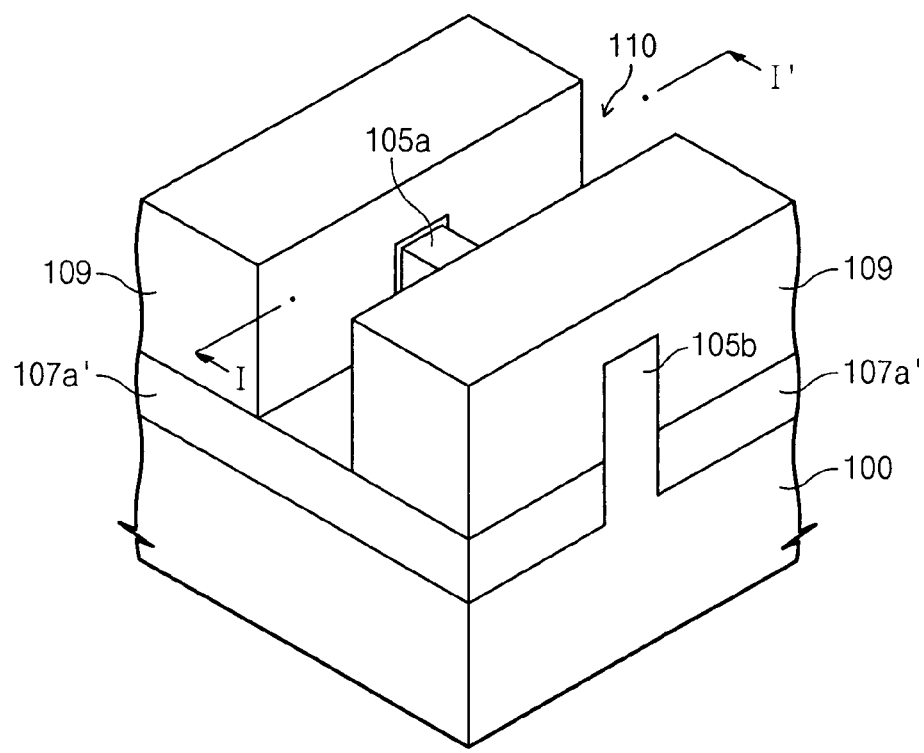
Figure 8B:
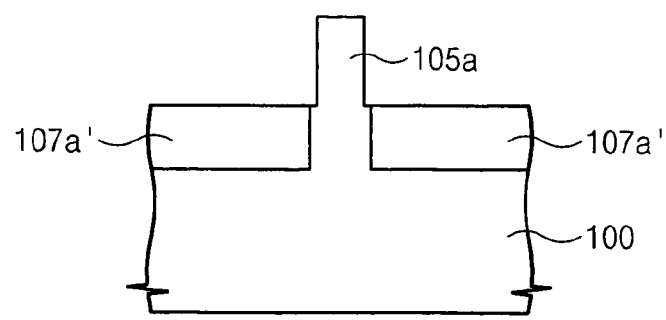

As illustrated in FIG. 6A and FIG. 6B, the filling insulation pattern 107a is recessed to expose an upper portion of the fin 105. Namely, a top surface of the recessed filling insulation layer 107a' is below the top surface of the fin 105. Preferably, the filling insulation pattern 107a is recessed using a wet etch.

As illustrated in FIG. 7A, FIG. 7B, FIG. 8A and FIG. 8B, a mold layer 109 is formed on the substrate 100. The mold layer 109 is made of a material having an etch selectivity with respect to the recessed filling insulation pattern 107a'. Preferably, the mold layer 109 is made of a material having an etch selectivity with respect to a thermal oxide layer. For example, the mold layer 109 is made of silicon nitride. If the mold layer 109 is made of silicon nitride, a buffer oxide layer (not shown) may be formed at the substrate 100 prior to formation of the mold layer 109. The buffer oxide layer may buffer a stress between the silicon nitride layer and the fin 102.

The mold layer 109 is patterned to form a groove 110 crossing the fin 105 in a perpendicular direction. The groove 110 exposes a portion of the fin 105. The exposed portion of the fin 105 includes both sidewalls and a top surface thereof. The groove 110 also exposes the recessed filling insulation pattern 107a' disposed on both sides of the exposed portion of the fin 105. An inner sidewall of the groove 110 is composed of only the mold layer 109. The buffer oxide layer (not shown) may be disposed on the exposed portion of the fin 105 and a surface of the recessed filling insulation pattern 107a'. The groove 110 divides the fin 105 into a channel portion 105a and a source/drain portion 105b. That is, the exposed portion of the fin 105 corresponds to the channel portion 105a and portions covered with the mold layer 109 at both sides of the channel portion 104a correspond to the source/drain portion 105b.

Preferably, a trimming process including a thermal oxidation process and a wet etch process is repeated at least once for a substrate 100 having the groove 110 to control the width of the channel portion 105a. Specifically, a thermal oxidation process is performed for a substrate 100 having the groove 110 to form a thermal oxide layer 112 on a surface of the channel portion 105a. If the buffer oxide layer is formed on the surface of the channel portion 105a, a process of removing the buffer oxide layer may be performed prior to formation of the thermal oxide layer 112.

The thermal oxide layer 112 is removed using a wet etch to trim the surface of the channel portion 105a and reduce the width thereof. Depending on the required width of the channel portion 105a, the trimming process may be repeated at least once. In the trimming process, the source/drain portion 105b is covered with the mold layer 109 to prevent reduction in width of the source/drain portion 105b.

When the channel portion 105a is trimmed, an inner sidewall of the groove 105 is composed of the mold layer 109. The mold layer 109 is made of a material having an etch selectivity with respect to the thermal oxide layer, e.g., silicon nitride. Therefore, the inner sidewall of the groove 105 is not etched even in the wet etch of the trimming process, thereby preventing a transistor malfunction caused when a sidewall of the groove 105 is partially etched.

Figure 9A:
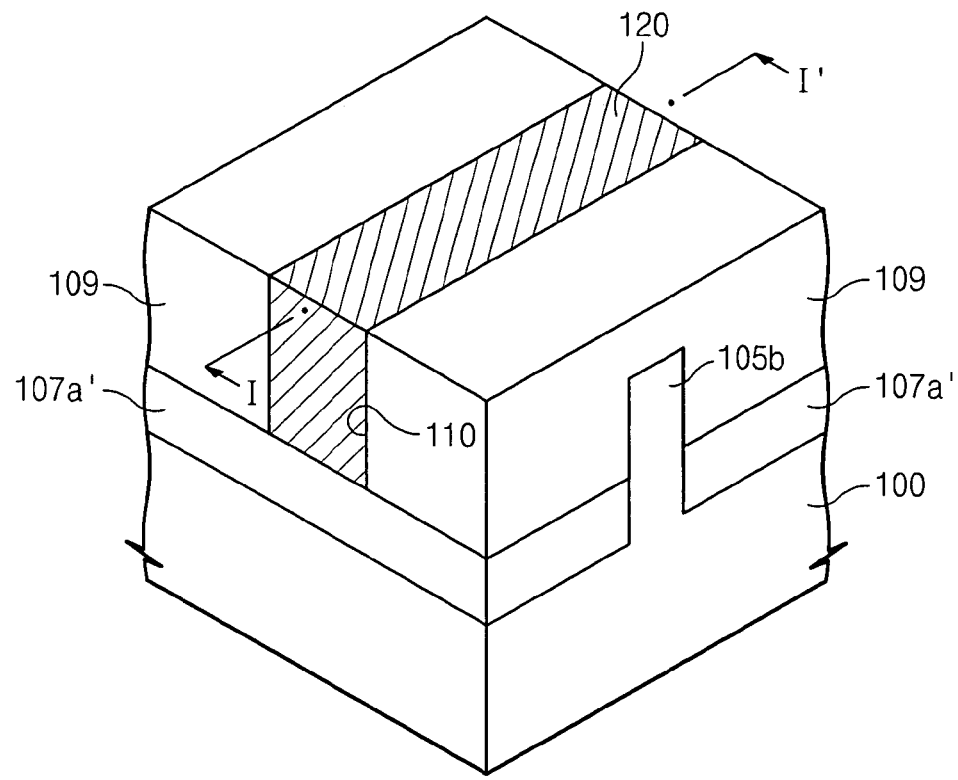
Figure 9B:
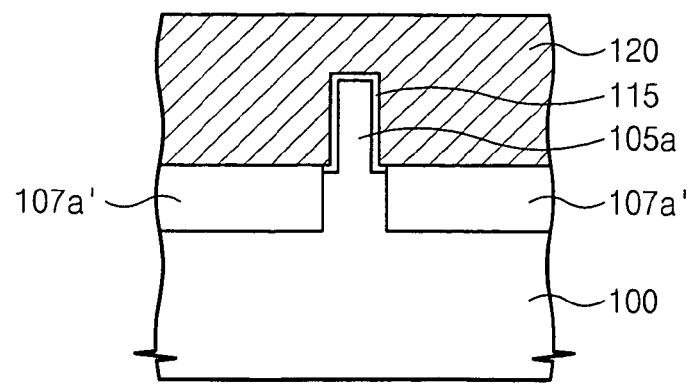

Referring to FIG. 9A and FIG. 9B, a gate insulation layer 115 is formed overlying the substrate 100 including the channel portion 105a. The gate insulation layer 115 may be made of thermal oxide. The gate insulation layer 115 is formed on the surface of the exposed fin 105. A gate conductive layer is formed on the substrate 100 to fill the groove 110. The gate conductive layer is planarized to form a gate electrode 120 in the groove 110, until the mold layer 109 is exposed. The gate electrode 120 may be made of doped polysilicon or a conductive metal-containing material. The conductive metal-containing material is, for example, metal such as molybdenum or tungsten, conductive metallic nitride such as titanium nitride or tantalum nitride, or metallic silicide such as tungsten silicide or cobalt silicide.

Figure 10A:
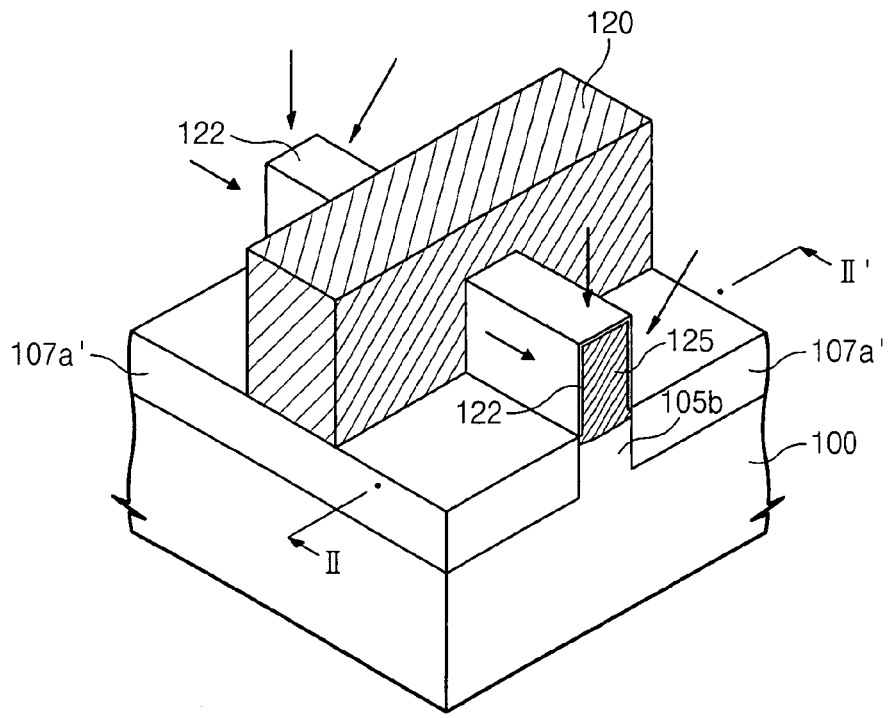
Figure 10B:
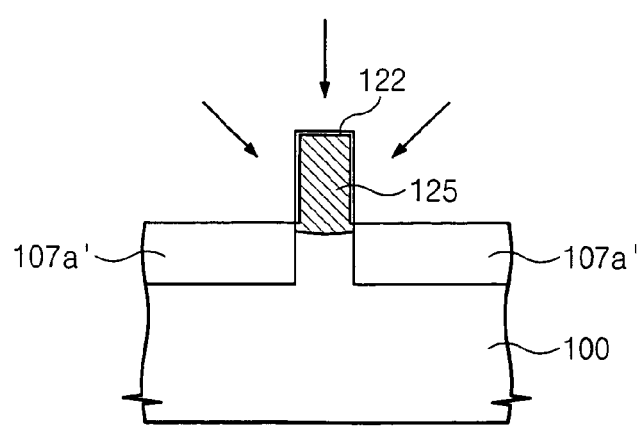
FIG. 10B is a cross-sectional view taken along a line II-II' of FIG. 10A.

Referring to FIG. 10A and FIG. 10B, the mold layer 109 is selectively removed to expose the source/drain portion 105b disposed on opposite sides of the gate electrode 120. An ion implanting buffer insulation layer 122 may be formed on the surface of the source/drain portion 105b. The ion implanting buffer insulation layer 122 may be made of thermal oxide. In this case, the thermal oxide layer 122 has a very small thickness to avoid reduction in width of the source/drain portion 105b. Alternatively, the ion implanting buffer insulation layer 122 may be a part of the buffer insulation layer (not shown) disposed below the mold layer 109.

Using the gate electrode 120 as a mask, impurities are implanted to form a source/drain region 125 at the source/drain portion 105b. The implantation of the impurities is done through the top surface and both sidewalls of the source/drain portion 105b. That is, because an upper part of the source/drain portion 105b protrudes above the recessed filling insulation pattern 107a', the impurities may be implanted to the substrate 100 vertically and obliquely. As a result, the source/drain region 125 may have a uniform impurity concentration. Namely, a source/drain region 125 having a uniform impurity concentration is formed on the top surface and both sidewalls of the source/drain portion 105b to prevent a fin transistor from being degraded due to the non-uniformity of impurity concentration.

As described, prior to formation of a mold layer, a filling insulation pattern is recessed to expose an upper portion of a fin. A gate electrode is formed in a groove formed in the mold layer. The mold layer is removed. A portion of the fin disposed on opposite sides of the gate electrode protrudes upwardly toward the recessed filling insulation pattern. Impurities are implanted vertically and obliquely to allow a source/drain region to have uniform impurity concentration. Thus, it is possible to prevent a fin transistor from being degraded due to non-uniform impurity concentration of a source/drain region.

Further, an inner sidewall of the groove is composed of a mold layer having an etch selectivity with respect to a thermal oxide layer. For this region, the inner sidewall of the groove is not etched even if a trimming process is performed for a channel portion of the fin exposed to the groove. Therefore, it is possible to prevent a fin transistor malfunction caused by increase in linewidth of a gate electrode formed at opposite sides adjacent to a fin when an inner sidewall of a groove is etched.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined in the appended claims.

What is claimed is:

1. A method of forming a fin transistor, the method comprising:

forming a vertically protruding fin on a substrate, the fin comprising a top surface and sidewalls;

forming a filling insulation pattern along the sidewalls of the fin;

recessing the filling insulation pattern to expose an upper portion of the fin;

forming a mold layer on the filling insulating pattern and the fin formed on the substrate;

patterning the mold layer to form a groove, the groove dividing the upper portion of the fin into channel and source/drain portions, wherein the channel portion comprises the portion of the fin exposed by the groove and the source/drain portions comprise the portions of the fin covered by the mold layer;

forming a gate electrode to fill the groove with a gate insulation layer interposed between the fin and the gate electrode;

removing the mold layer to expose the source/drain portions of the fin disposed on opposite sides of the gate electrode; and implanting impurities through the top surface and the sidewalls of the source/drain portions of the fin to form source/drain regions.

2. The method as recited in claim 1, wherein recessing the filling insulation pattern comprises wet etching the filling insulation pattern.

3. The method as recited in claim 1, wherein implanting impurities further comprises using the gate electrode as a mask.

4. The method as recited in claim 1, further comprising: controlling the width of the channel portion of the fin.

5. The method as recited in claim 4, wherein controlling the width of the channel portion comprises trimming the channel portion of the fin at least twice.

6. The method as recited in claim 4, wherein controlling the width of the channel portion comprises, before forming the gate insulation layer:

forming a thermal oxide layer on the surface of the channel portion, wherein the mold layer is made of material having an etch selectivity with respect to the thermal oxide layer; and removing the thermal oxide layer.

7. The method as recited in claim 6, wherein removing the thermal oxide layer comprises wet etching the thermal oxide layer.

8. The method as recited in claim 1, wherein patterning the mold layer to form the groove comprises patterning the mold layer to form the groove in the mold layer.

9. The method as recited in claim 1, wherein the top surface of the source/drain portions of the fin are covered by the mold layer.

10. The method as recited in claim 1, wherein, after patterning the mold layer to form the groove, the mold layer covers a portion of the top surface of the fin.

11. The method as recited in claim 10, wherein removing the mold layer to expose the source/drain regions of the fin comprises, after forming the gate electrode, removing the mold layer from the portion of the top surface of the fin.

* * * * *